(12) United States Patent
Watanabe

(10) Patent No.: US 6,680,865 B2
(45) Date of Patent: Jan. 20, 2004

(54) NONVOLATILE MEMORY FOR WHICH PROGRAM OPERATION IS OPTIMIZED BY CONTROLLING SOURCE POTENTIAL

(75) Inventor: Keisuke Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/098,338

(22) Filed: Mar. 18, 2002

(65) Prior Publication Data

US 2003/0072176 A1 Apr. 17, 2003

(30) Foreign Application Priority Data

Oct. 12, 2001 (JP) .................................... 2001-315174

(51) Int. Cl.[7] .............................................. G11C 16/04
(52) U.S. Cl. .............................. 365/185.26; 365/185.14
(58) Field of Search ..................... 365/185.26, 185.01, 365/185.11, 185.14, 185.28, 226, 230.06

(56) References Cited

U.S. PATENT DOCUMENTS 5,204,839 A * 4/1993 Lee et al. .................... 365/204
5,343,434 A * 8/1994 Noguchi ................. 365/185.04
5,642,309 A * 6/1997 Kim et al. ............. 365/185.22

* cited by examiner

Primary Examiner—Thong Q. Le
(74) Attorney, Agent, or Firm—Arent Fox Kintner Plotkin & Kahn, PLLC

(57) ABSTRACT

In a non-volatile memory, the source potential of a selected cell transistor to be programmed is controlled to be changed in accordance with a distance between a program voltage generator connected to a bit line and to the selected cell transistor. When the distance between the selected cell transistor and the program voltage generator is a first distance, the source potential at the selected cell transistor is controlled to be a first potential, and when the distance between them is a second distance longer than the first distance, the source potential at the selected cell transistor is controlled to be a second potential higher than the first potential. As a result, the drain-source voltage at the selected cell transistor to be programmed can be optimized, and optimization of the programming can be implemented.

16 Claims, 5 Drawing Sheets

NONVOLATILE MEMORY FOR WHICH PROGRAM OPERATION IS OPTIMIZED BY CONTROLLING SOURCE POTENTIAL

FIELD OF THE INVENTION

The present invention relates to a semiconductor nonvolatile memory, and in particular, to a nonvolatile memory for which program operation is optimized by controlling its source potential.

BACKGROUND OF THE INVENTION

As one of the semiconductor nonvolatile memories, flash memory is available which uses a cell transistor having a floating gate. Since data can be retained in flash memory in the power-OFF state, and since its memory capacity is large and data can be read from it rapidly, flash memory is widely employed for portable phones and portable information terminals.

FIG. 1 is a diagram showing the general arrangement of flash memory. In FIG. 1, memory cells MC1, MC2 and MC3, each constituted by a transistor having a floating gate FG, are arranged at intersections of word lines WL1, WL2 and WL3 and a bit line BL. For each cell transistor, an N-type source region S and an N-type drain region D are formed at the surface of a P-type substrate, and a floating gate FG and a control gate CG are formed, via an insulating film, over a channel region between the source and drain regions. The control gates CG are respectively connected to the word lines WL1, WL2 and WL3, the drain regions D are connected to the bit line BL, and the source regions S are connected to source line SL.

Each cell transistor maintains a data "1" state, wherein no charges (e.g., electrons) are injected into the floating gate FG, and a data "0" state, wherein charges are injected. The threshold voltage is low for the data "1" and is high for the data "0" states. Therefore, when a middle voltage, one between the two threshold voltages, is applied to the word line WL and the source line SL is grounded, the reading of data from the memory cell is possible because a drain current difference exists between the two states. Further, when a multi-leveled memory cell is employed, the charges injected into the floating gate FG have at least three states, and these states are also detected through the drain current.

During the programming, for a cell transistor in a data "1" state (an erased state), wherein no charges are injected into the floating gate FG, the bit line BL is set at a high potential, such as 6 V, the word lineWL is set at a high potential, such as 10 V, and the source line SL is set to a low potential, such as a ground level. Thus, a hot electron is generated by the application of a high voltage between the source and the drain, and is injected into the floating gate FG. In this case, the ground potential is applied to a non-selected word line WL to prevent the cell transistor, which is not to be operated, from being rendered on.

During the erasing operation, the word line WL is set to a ground potential or a negative potential, the source line SL is set to a high potential, and the bit line is set in the floating state, so that charges on the floating gate FG are extracted toward the source region.

FIG. 2 is a circuit diagram showing a conventional source line voltage generator and a cell array. In a sector SCT, which includes a cell array, as in FIG. 1, cell transistors MC1, MC2 and MC3 are arranged at the intersections of word lines WL1, WL2 and WL3 and a bit line BL. The control gates of the individual cell transistors MC1 to MC3 are respectively connected to the word lines WL1, WL2 and WL3, and the drain terminals are connected to the bit line BL. Further, the source terminals of the cell transistors MC of the sector SCT are connected to a common source line SL.

A program voltage generator 10 is connected to the bit line BL to generate the previously described high voltages during the programming. Further, a source line voltage generator 12 is connected to the source line SL.

During the programming, a high voltage of about 6 V is applied to the bit line BL, to which a selected cell transistor to be programmed (e.g., MC3 in FIG. 2) is connected, and a high voltage of about 10 V is applied to the selected word line WL3. Also, 0 V is applied to the word lines WL1 and WL2, which are not selected, so that non selected cell transistors (MC1 and MC2 in FIG. 2) are prevented from being rendered conductive.

However, even though the word lines WL1 and WL2 for the non selected cell transistors MC1 and MC2 is adjusted to 0 V, since a high voltage is applied to the bit line BL, the potential at the floating gate FG is raised due to the coupling with the drain region D connected to the bit line BL, and the cell transistors MC2 and MC2 may be rendered on. Accordingly, current leaks from these cell transistors are fed to the bit line BL, and due to a voltage drop resulting from a parasitic resistance RBL along the bit line BL, the drain potential of the selected cell transistor is lowered. Therefore, the source-drain voltage is not enough and a programming defect occurs.

In order to prevent this programming defect, conventionally, during the programming the source line voltage is adjusted so it is slightly higher than the ground potential. That is, during the programming, in accordance with a program control signal /PGM, which is set to level L, the source line voltage generator 12 in FIG. 2 adjusts the potential on the source line SL to be slightly higher than ground potential Vss, and when the programming is not performed, the source line generator 12 adjusts the potential on the source line SL to be the ground potential Vss. Also during the programming, a transistor Q1 is rendered off and a transistor Q2 is rendered on upon the reception, via an inverter, of the program control signal /PGM. Further, the potential ARVss on the source line SL is adjusted by a resistor Rp so it is slightly higher than the ground potential Vss. Whereas when programming is not performed, the transistor Q1 is rendered on and the potential ARVss on the source line SL is adjusted to be the ground potential Vss.

During the programming, the potential ARVss of the source line SL is set higher than the ground potential Vss, the source potential at the non-selected cell transistor is raised, and due to a back bias effect, the threshold voltage at that cell transistor is substantially raised, and a current leak at the non-selected cell transistor is prevented.

However, as the capacity of the non-volatile memory have been recently increased, the cell array region has been increased and the resistance RBL on the bit line BL and the resistance RSL on the source line SL becomes too high to be ignored. Further, when as in the memory cell MC3 in FIG. 3 the selected cell transistor is located away from both the program voltage generator 10 and the source line voltage generator 21, the drain potential is lowered due to the resistance RBL on the bit line BL, the source potential is raised, and the drain-source voltage VDS at the cell transistor MC3 is reduced. This unsatisfactory drain-source voltage causes the programming time to be extended and the programming disabled.

SUMMARY OF THE INVENTION

To resolve the above shortcoming, it is one objective of the present invention to provide a non-volatile memory for which programming is optimized.

To achieve this objective, according to one aspect of the present invention, in a non-volatile memory, the source potential of a selected cell transistor to be programmed is controlled to be changed in accordance with a distance between a program voltage generator connected to a bit line and to the selected cell transistor. In the preferred embodiment of the present invention, when the distance between the selected cell transistor and the program voltage generator is a first distance, the source potential at the selected cell transistor is controlled to be a first potential, and when the distance between them is a second distance longer than the first distance, the source potential at the selected cell transistor is controlled to be a second potential higher than the first potential. As a result, the drain-source voltage at the selected cell transistor to be programmed can be optimized, and optimization of the programming can be implemented.

DETAILED DESCRIPTION OF THE PREFERRED EMBODIMENT

The preferred embodiment of the present invention will now be described while referring to the accompanying drawings. It should be noted, however, that the scope of the present invention is not limited to this embodiment, but covers the invention as recited in the claims and their equivalent.

Figure 3:
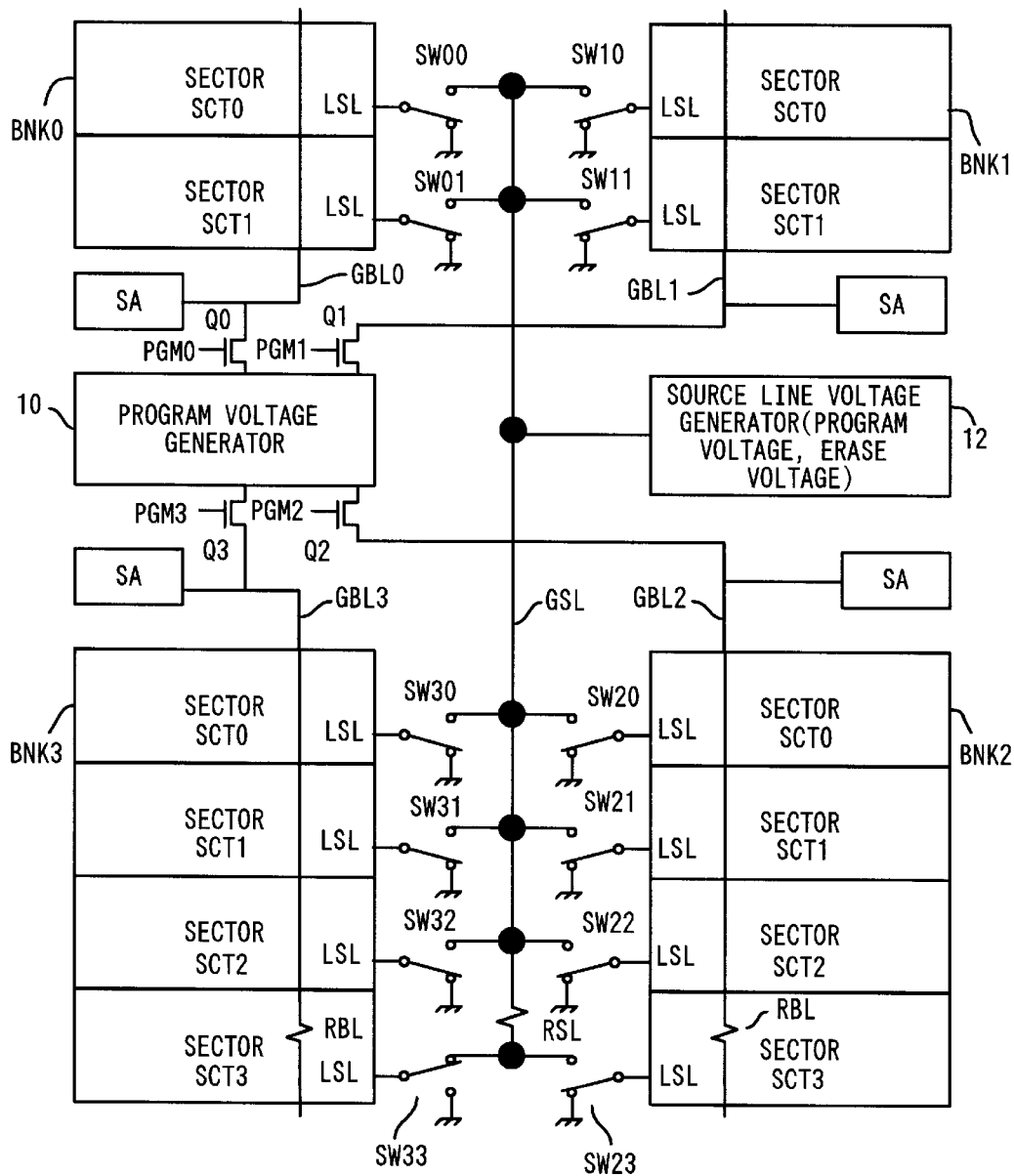
FIG. 3 is a diagram showing the overall arrangement of a non-volatile memory according to one embodiment of the present invention.

FIG. 3 is a diagram showing the general arrangement of a non-volatile memory according to the embodiment. As is shown in FIG. 3, a memory of the present embodiment includes: four memory banks BNK0 to BNK3; sense amplifiers SA provided for the banks BNK0 to BNK3; and a program voltage generator 10 and a source line voltage generator 12 arranged in the center of a chip. That is, the program voltage generator 10 and the source line voltage generator 12 are located between the memory banks BNK0 and BNK1 and the memory banks BNK2 and BNK3, and at one side of each memory bank.

Each bank is divided into a plurality of sectors. For example, the memory banks BNK0 and BNK1 each have two sectors SCT0 and SCT1, and the memory banks BNK2 and BNK3 each have four sectors SCT0, SCT1, SCT2 and SCT3. For each bank, however, the number of sectors shown is merely an example; the number of sectors which can be used is not hereby limited.

Figure 1:
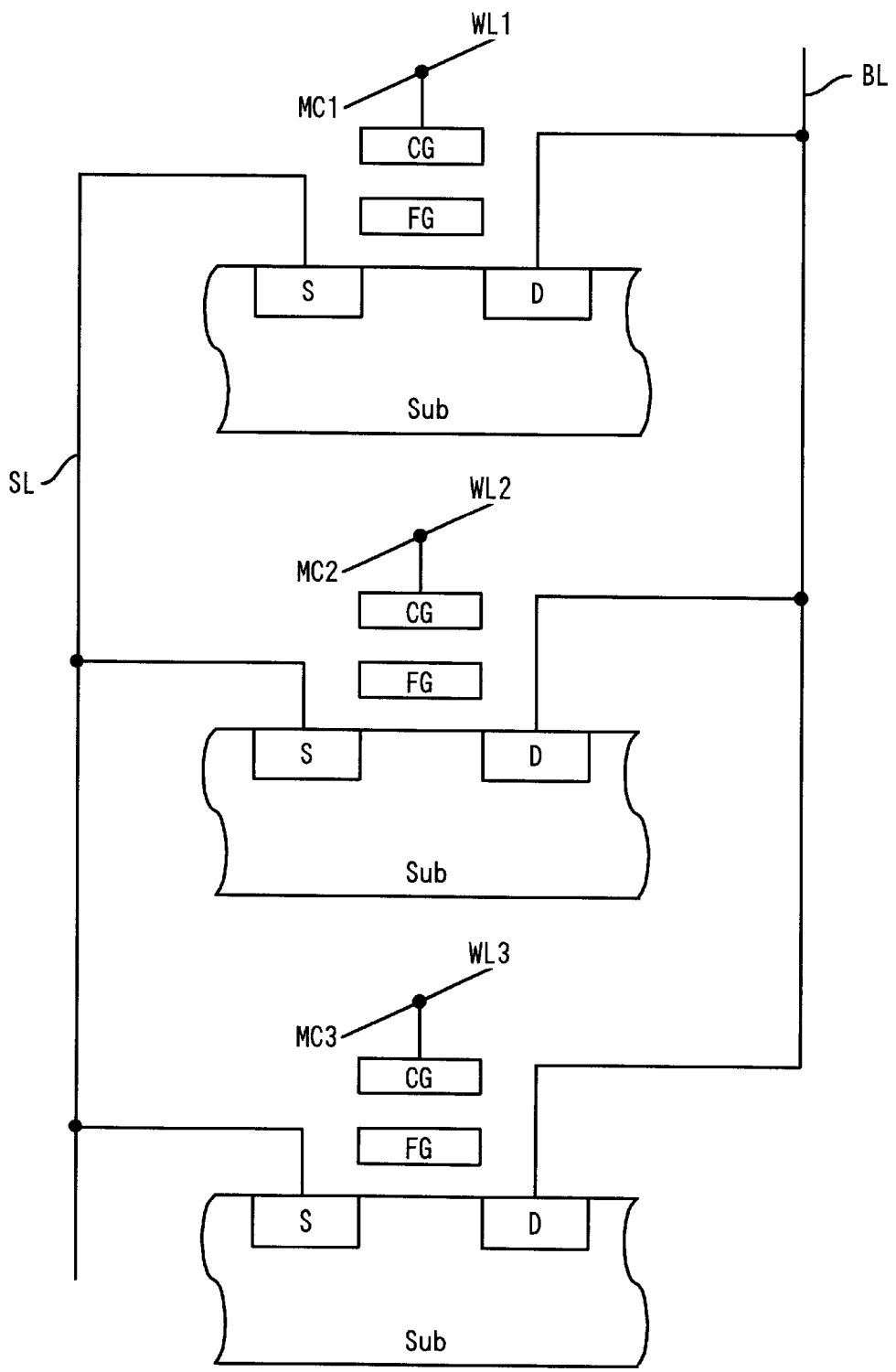
FIG. 1 is a diagram showing the general arrangement of a flash memory.
Figure 2:
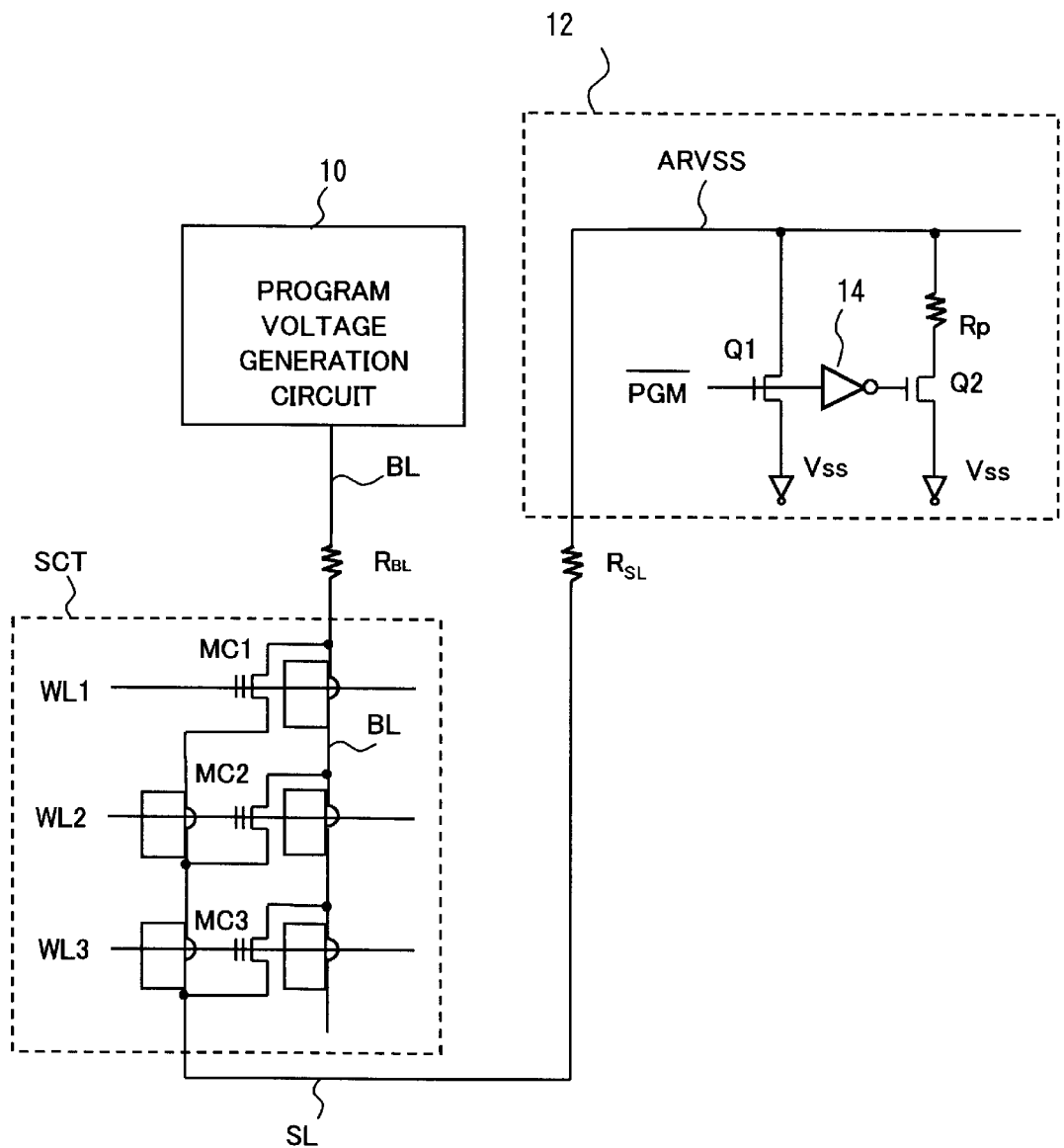
FIG. 2 is a circuit diagram showing a conventional source line voltage generator and a cell array.

As is shown in FIGS. 1 and 2, each sector includes a plurality of bit lines, a plurality of word lines and a plurality of cell transistors located at the intersections therebetween.

The bit lines in each sector are connected to a global bit line GBL provided for a corresponding memory bank, BNK0 to BNK3. Sense amplifiers SA are connected to the global bit lines GBL, and to read data, the current at the drain of a selected cell transistor is detected by one of the sense amplifiers SA along the local bit line for the sector and the global bit line GBL for the bank.

During the programming, the program voltage generator 10 generates a high bit line voltage, and applies this voltage to the global bit lines GBL using bank selection transistors Q0 to Q3. The bit line voltage is then applied, via one of the global bit lines GBL, to one of the local bit lines in the sectors. The bank selection transistors Q0 to Q3 are controlled in accordance with program bank selection signals PGM0 to PGM3, generated by using a program control signal and a bank selection signal.

The source terminals of the cell transistors in each sector are connected to a common local source line LSL in the sector, and the local source line LSL can be connected to a global source line GSL along a corresponding sector select switch SW00 to SW33. A source line voltage generated by the source line voltage generator 12 is applied to the global source line GLS, and is transmitted through the sector selection switch and the local source line LSL of the selected sector to the sources of the cell transistors in the sector. The source line voltage generator 12 generates, for example, a source line voltage for programming and a source line voltage for erasing.

In the example in FIG. 3, the sector selection switch SW33 connects the local source line LSL of the sector SCT3 in the bank BNK3 to the global source line GSL, and the remaining sector selection switches SW00 to SW32 are connected to the ground terminals. Therefore, a programming voltage or erasing voltage for a source line is applied from the source line voltage generator 12 to the local source line LSL of the sector SCT3 in the bank BNK3. That is, during the programming, the source line voltage generator 12 applies, to the local source line LSL of the sector SCT3, the source line voltage which is optimized in accordance with the location of the sector SCT3. And during the erasing, the source line voltage generator 12 applies to the local source line LSL a high voltage for erasing. As a result, each sector is simultaneously erased. Since the erasing is performed sector by sector in the flash memory, the local source line LSL common in the sector is provided in the example in FIG. 3.

The memory banks BNK2 and BNK3 in FIG. 3 have more sectors SCT0 to SCT3 than the memory banks BNK0 and BNK1. Accordingly, the global bit lines GBL and the local bit lines LBL of the memory banks BNK2 and BNK3 are longer, and due to a voltage drop at the resistors RBL, the programming voltage on the bit lines in sector SCT3, which is located farthest from the program voltage generator 10, is greatly reduced. For the same reason, the global source line GSL and the local source line LSL to the memory banks BNK2 and BNK3 are longer, and due to a voltage boost at the resistors RSL, the source voltage in sector SCT3, which is located farthest from the source line voltage generator 12, is greatly increased.

As a result, in sector SCT3, the drain-source voltage at the cell transistor to be programmed is reduced and is lower than the voltages at the cell transistors in the sectors SCT0, SCT1 and SCT2. Therefore, an extended period of time may be required for the programming of the cell transistor in sector SCT3, or in a worst case the programming may be disabled.

Therefore, in this embodiment, when a sector including a cell transistor to be programmed is located near the programming voltage generator 10, the drain voltage drop is smaller, so that the source line voltage generator 12 maintains a comparatively high source line voltage. When, however, the sector including the cell transistor to be programmed is located farther away from the programming voltage generator 10, the drain voltage drop is much larger, so that the source line voltage generator 12 maintains a comparatively low source line voltage. The control thus provided is performed in accordance with a sector selection signal (not shown). As a result, it is possible to prevent an excessive reduction in the drain-source voltage at a cell transistor to be programmed, as well as the possibility that a programming error will occur. Further, the source potential of a non-selected cell transistor can also be optimized in accordance with the drain potential, so that a leak current due to unnecessary conduction of the non-selected cell transistor can be prevented.

When the cell array is not divided into sectors, the source line voltage generator 12 controls the source voltage in accordance with the location of a cell transistor to be programmed, so that the drain-source voltage at the cell transistor to be programmed can be optimized, and the leak current at the non-selected cell transistor, connected to the same source line, is prevented.

When the cell array is divided into sectors, the source line voltage generator 12 may also control the source line voltage in accordance with the location of the cell transistor in a sector. In this case, the source line voltage generator 12 variably controls the source line voltage in accordance with the address of the cell transistor to be programmed. When the cell array is constituted by a plurality of blocks each formed of a plurality of sectors, the source line voltage may be controlled in the above manner in accordance with the location of each block. In this case, the source line voltage is variably controlled in accordance with the block address of a block to be programmed.

Figure 4:
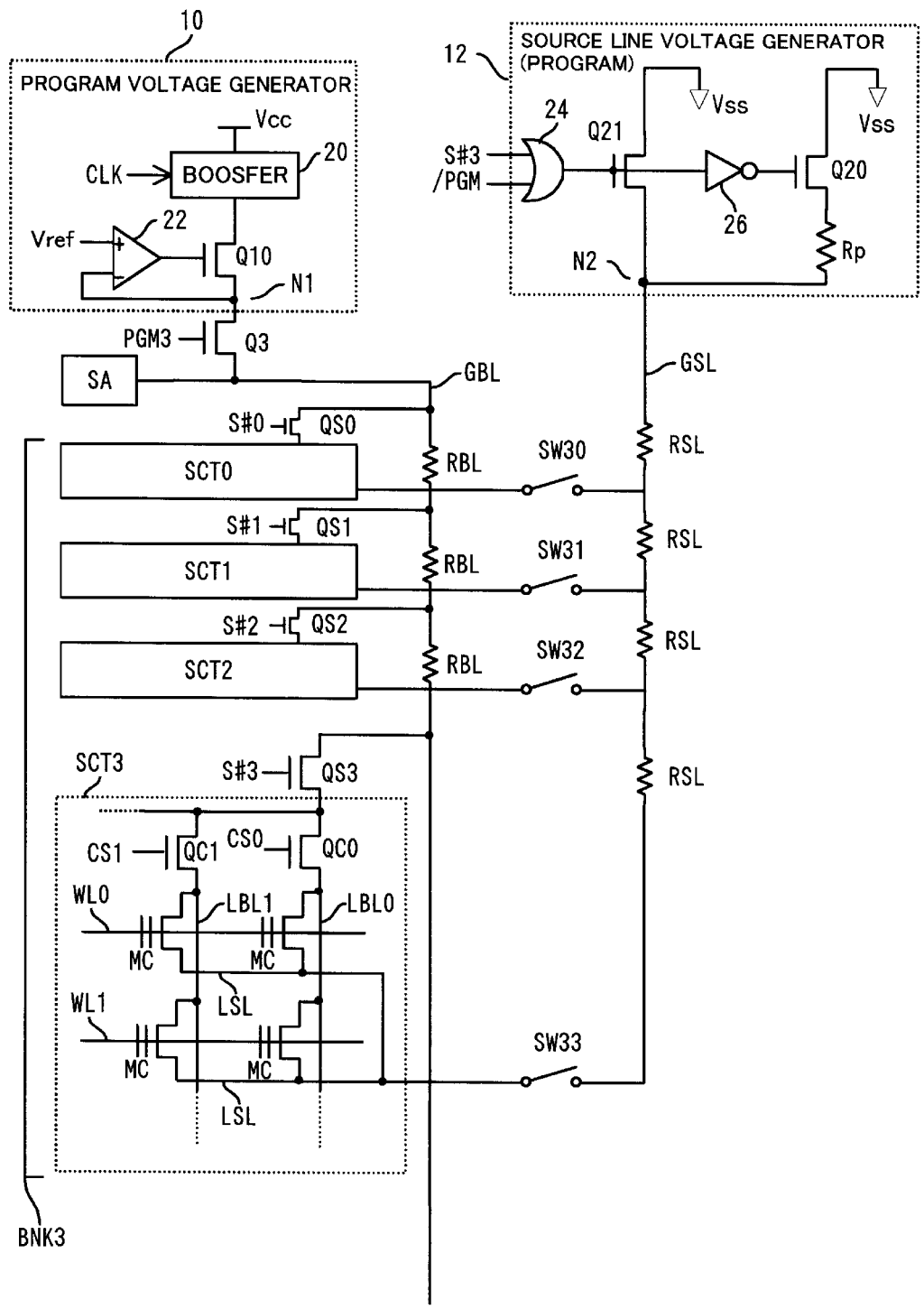
FIG. 4 is a detailed circuit diagram showing a program voltage generator and a source line voltage generator according to the embodiment.

FIG. 4 is a detailed circuit diagram showing the program voltage generator 10 and the source voltage generator 12 according to the embodiment. In FIG. 4, the program voltage generator 10 and the source voltage generator 12 are located at one side (at the upper side in FIG. 4) of the memory bank BNK3 shown in FIG. 3.

The memory bank BNK3 has four sectors SCT0 to SCT3, and as is shown for the sector SCT3, each sector includes a plurality of local bits LBL0 and LBL1, a plurality of word lines WL0 and WL1, and a plurality of cell transistors MC located at their intersections. In sector SCT3, the local bits LBL0 and LBL1 are selected by column gates QC0 and QC1, for which control is provided by column selection signals CS0 and CS1. A group of local bits in the individual sectors are respectively connected to the global bit GBL through sector selection transistors QS0 to QS3, which are rendered conductive or non-conductive in accordance with sector select signals S#0 to S#3. During the programming, a program voltage generated by the program voltage generator 10 is applied to the global bit line GBL through the transistor Q3, which is rendered conductive in accordance with the select signal PGM3.

Therefore, when the cell transistors in sector SCT3 of memory bank BNK3 are to be programmed, for the programming a bit line voltage is applied to the local bit line LBL through the transistor Q3, the global bit line GBL, the sector selection transistor QS3 and the column gate QC0 or QC1.

The program voltage generator 10 includes: a booster circuit 20 for raising the power source voltage Vcc in accordance with a clock CLK; and a transistor Q10 and a comparator 22, which together constitute a voltage regulator for supplying the boosted voltage to the global bit line GBL. When the potential at node N1 is reduced by increasing the bit line current, the output of the comparator 22 goes high and the transistor Q10 is rendered on in order to maintain the potential at the node N1. In any event, during the programming, the program voltage generator 10 applies a programming voltage to the bit line.

The source voltage generator 12 includes transistors Q20 and Q21, an OR gate 24, an inverter 26 and a resistor Rp, which together constitute impedance means. The sources of the transistors Q20 and Q21 are connected to the ground potential Vss, and the drains are connected to a global source line GSL, either directly or via the resistor Rp.

The OR gate 24 receives the program control signal /PGM, which is level L during the programming, and the sector select signal S#3 for selecting sector SCT3. Therefore, during the programming, when sectors SCT0, SCT1 and SCT2 in the memory bank BNK3 are selected, the sector select signal S#3 goes L level, the output of the OR gate 24 goes L level, and the transistor Q20 is rendered conductive. Therefore, at a node N2 the voltage generated by the source voltage generator 12 is higher than the ground potential Vss by the voltage drop at the resistor Rp. Thus, the potentials at the sources of the cell transistors in sectors SCT0, SCT1 and SCT2 are higher than the ground potential Vss by the voltage drops at the inserted resistor Rp and the resistor RSL along the global source line GSL, thereby the leak current at the non-selected cell transistor is appropriately suppressed.

Furthermore, when sector SCT3 in memory bank BNK3 is selected during the programming, the sector select signal S#3 goes H level, and the transistor Q21 is rendered conductive, so that the voltage at the node N2 equals the ground level Vss. Therefore, the source potentials at the cell transistors in the sector SCT3 increases only by a voltage drop at the resistor RSL along the global source line GSL from the ground potential, and the drain-source voltage at a selected cell transistor is prevented from being reduced more than necessary. That is, the source potentials at the cell transistors in the sector SCT3 are controlled to be lower than the source voltages at the cell transistors in the other sectors, and even when the drain potential is reduced by the resistance along the bit line, the drain-source voltage of the selected cell transistor is controlled to be a satisfactory level.

Figure 5:
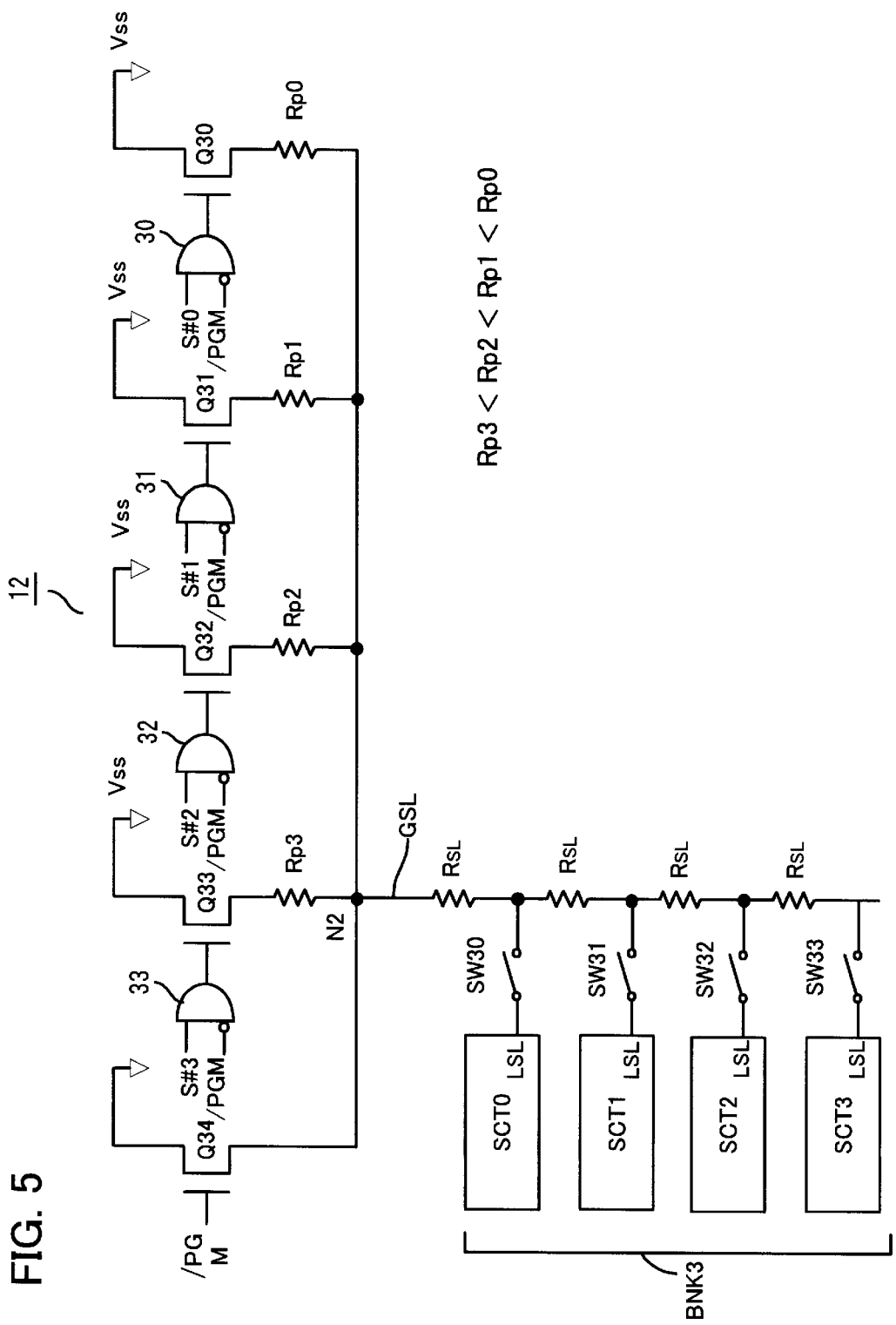
FIG. 5 is a diagram showing another example source line voltage generator according to the embodiment.

FIG. 5 is a diagram showing another example for the source line voltage generator 12. In FIG. 5, only the bank BNK3 and the source line voltage generator 12 are shown; the program voltage generator 10 and the bit line are not shown. The source line voltage generator 12 controls the output voltage of the node N2 to a different voltage in accordance with a selected sector to be programmed. To provide this control, the source line voltage generator 12 includes transistors Q30 to Q33, and in accordance with sector select signals S#0 to S#3, different resistors, Rp0 to Rp3, are inserted between the terminal at the ground potential Vss and the global source line GSL. That is, during the programming, when the program control signal /PGM goes L level, among the AND gates 30 to 33 to which the inverted program control signals are input, the AND gate at which the sector select signal S#0 to S#3 at level H is received has an output at level H, and one of the transistors Q30 to Q33 is rendered on.

As is shown in FIG. 5, the relationship Rp3<Rp2<Rp1<Rp0 is established for the resistors Rp0 to Rp3. Therefore, the potentials at the nodes N2 are reduced in order in correlation with the selected sectors SCT0, SCT1, SCT2 and SCT3. As a result, the potentials on the local source lines LSL of the sectors SCT0, SCT1, SCT2 and SCT3 are reduced in order. The relationship of the potentials on the local source line LSL corresponds to the relationship of the drain potentials at the cell transistors accompanied by the voltage drop at the resistors along bit lines (not shown). Therefore, in each sector, the drain-source voltage at the cell transistor to be programmed is controlled and maintained at the optimal value, and a reduction in programming speed and the occurrence of defects can be prevented.

The source line voltage generator 12 in FIG. 5 includes a transistor Q34 controlled by the program control signal /PGM. At times other than during the programming, the control signal /PGM goes L level, the transistor Q34 is rendered on, and the ground potential Vss is applied to the global source line GSL.

As is described above, according to the present embodiment, since during the programming the source line voltage generator generates different source line voltages in accordance with the location of a selected cell transistor, it is possible to keep the drain-source voltage at the cell transistor from being unnecessarily reduced, and to prevent a reduction in programming speed and the occurrence of programming error.

As is described above, for a non-volatile memory according to the present invention, the source potential at a selected cell transistor to be programmed is controlled in accordance with the distance between the selected cell transistor and the program voltage generator for supplying a program voltage to bit lines. Therefore, it is possible to prevent the drain-source voltage from being too low, and the programming speed from being slow or a programming error.

What is claimed is:

1. A non-volatile memory comprising:
    a cell array including
        a plurality of bit lines;
        a plurality of word lines;
        a plurality of cell transistors, arranged at intersections of said bit lines and said word lines, drains of which are connected to said bit lines and gates of which are connected to said word lines; and
        a source line connected to sources of said cell transistors;
    a program voltage generator for generating a program voltage to be applied to said bit lines; and
    a source line voltage generator for changing a source potential for a selected cell transistor to be programmed, in accordance with a wiring distance between said program voltage generator and said selected cell transistor.

2. The non-volatile memory according to claim 1, wherein said cell array includes a plurality of sectors each of which contains a plurality of cell transistors, a plurality of bit lines, a plurality of word lines and a common source line; and wherein said source line voltage generator changes said source potential in accordance with a sector containing a selected cell transistor to be programmed.

3. The non-volatile memory according to claim 2, wherein, during the programming, said source line voltage generator changes a source line voltage in response to said sector select signal.

4. The non-volatile memory according to claim 1, wherein, when a distance between said program voltage generator and the selected cell transistor is a first wiring distance, said source line voltage generator controls the source potential of said selected cell transistor to a first potential; and wherein, when said distance is a second wiring distance greater than said first wiring distance, said source line voltage generator controls said source potential for said selected cell transistor to a second potential lower than said first potential.

5. The non-volatile memory according to claim 1, wherein, when a bit line between said program voltage generator and the selected cell transistor has a first length, said source line voltage generator controls the source potential of said selected cell transistor to a first potential; and wherein, when said bit line has a second length greater than said first length, said source line voltage generator controls said source potential of said selected cell transistor to a second potential lower than said first potential.

6. The non-volatile memory according to claim 1, wherein, in accordance with said wiring distance, said source line voltage generator inserts different impedance element between said source line and a ground terminal.

7. The non-volatile memory according to claim 6, wherein, when a distance between said program voltage generator and the selected cell transistor is a first wiring distance, said source line voltage generator inserts a first impedance element; and when said distance is a second wiring distance greater than said first wiring distance, said source line voltage generator inserts a second impedance element smaller than said first impedance element.

8. The non-volatile memory according to claim 6, wherein, when a bit line between said program voltage generator and the selected cell transistor has a first length, said source line voltage generator insets a first impedance element; and, when said bit line has a second length greater than said first length, said source line voltage generator inserts a second impedance element smaller than said first impedance element.

9. The non-volatile memory according to claim 1, wherein, when a distance between said program voltage generator and the selected cell transistor is a first wiring distance, said source line voltage generator inserts a first impedance element between said source line and a ground potential; and, when said distance is a second wiring distance greater than said first wiring line, said source line voltage generator connects said source line to said ground potential.

10. The non-volatile memory according to claim 1, wherein, when a bit line between said program voltage generator and the selected cell transistor has a first length, said source line voltage generator inserts a first impedance element between said source line and a ground potential and when said bit line has a second length greater than said first length, said source line voltage generator connects said source line to said ground potential.

11. The non-volatile memory according to claim 1, wherein said cell transistor has a floating gate; and, during the programming, said program voltage generator applies a first high potential to the bit line of the selected cell transistor and a word line thereof is controlled to be a second high potential.

12. The non-volatile memory according to claim 1, wherein said program voltage generator and said source line voltage generator are located at one side of said cell array.

13. A non-volatile memory comprising:
    a plurality of sectors each including
        a plurality of bit lines;
        a plurality of word lines;
        a plurality of cell transistors, arranged at intersections of said bit lines and said word lines, drains of which are connected to said bit lines and gates of which are connected to said word lines; and a source line connected to sources of said cell transistors; a program voltage generator for generating a program voltage to be applied to said bit lines; and a source line voltage generator for changing a potential of said source line in accordance with a wiring distance between said program voltage generator and a selected sector to be programmed.

14. The non-volatile memory according to claim 13, wherein, when a distance between said program voltage generator and said selected sector is a first distance, said source line voltage generator controls the source line potential of said selected sector to a first potential; and, when said distance is a second distance greater than said first distance, said source line voltage generator controls said source line potential for said selected sector to a second potential lower than said first potential.

15. The non-volatile memory according to claim 13, wherein, when a bit line between said program voltage generator and said selected sector has a first length, said source line voltage generator controls the source line potential of said selected sector to a first potential; and, when said bit line has a second length greater than said first length, said source line voltage generator controls said source line potential of said selected sector to a second potential lower than said first potential.

16. The non-volatile memory according to claim 13, wherein said program voltage generator and said source line voltage generator are located at one side from said plurality of sectors.

* * * * *